US009862595B2

(12) United States Patent
Jing

(10) Patent No.: US 9,862,595 B2
(45) Date of Patent: Jan. 9, 2018

(54) METHOD FOR MANUFACTURING THIN-FILM SUPPORT BEAM

(71) Applicant: CSMC TECHNOLOGIES FAB1 CO., LTD., Wuxi New District (CN)

(72) Inventor: Errong Jing, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 0 days.

(21) Appl. No.: 15/023,057

(22) PCT Filed: Dec. 4, 2014

(86) PCT No.: PCT/CN2014/093054
§ 371 (c)(1),
(2) Date: Mar. 18, 2016

(87) PCT Pub. No.: WO2015/103910
PCT Pub. Date: Jul. 16, 2015

(65) Prior Publication Data
US 2016/0229691 A1 Aug. 11, 2016

(30) Foreign Application Priority Data
Jan. 7, 2014 (CN) .......................... 2014 1 0007410

(51) Int. Cl.
H01L 21/30 (2006.01)
H01L 21/46 (2006.01)
B81C 1/00 (2006.01)

(52) U.S. Cl.
CPC .... *B81C 1/00142* (2013.01); *B81C 2201/013* (2013.01); *B81C 2201/0108* (2013.01); *B81C 2201/0109* (2013.01)

(58) Field of Classification Search
CPC ........... H01L 29/7869; H01L 21/02565; H01L 21/02628; H01L 21/02554;
(Continued)

(56) References Cited

U.S. PATENT DOCUMENTS

2007/0281497 A1* 12/2007 Liu ...................... H01L 21/3105
438/781
2008/0105951 A1* 5/2008 Sato .................... B81C 1/00246
257/619
(Continued)

FOREIGN PATENT DOCUMENTS

CN 101289160 10/2008
CN 101381070 3/2009
(Continued)

OTHER PUBLICATIONS

Deng et al., U.S. Appl. No. 14/902,516, International Application Filing Date Jul. 29, 2014.
(Continued)

*Primary Examiner* — Charles Garber
*Assistant Examiner* — Abdulfattah Mustapha
(74) *Attorney, Agent, or Firm* — Kagan Binder, PLLC

(57) ABSTRACT

A method for manufacturing a film support beam includes: providing a substrate having opposed first and second surfaces; coating a sacrificial layer on the first surface of the substrate, and patterning the sacrificial layer; depositing a dielectric film on the sacrificial layer to form a dielectric film layer, and depositing a metal film on the dielectric film layer to form a metal film layer; patterning the metal film layer, and dividing a patterned area of the metal film layer into a metal film pattern of a support beam portion and a metal film pattern of a non-support beam portion, wherein a width of the metal film pattern of the support beam portion is greater than a width of a final support beam pattern, and a width of the metal film pattern of the non-support beam portion is equal to a width of a width of a final non-support beam pattern at the moment; photoetching and etching on the metal film layer and the dielectric film layer to obtain the final support beam pattern, the final non-support beam pattern and a final dielectric film layer, wherein the final (Continued)

dielectric film layer serves as a support film of the final support beam pattern and the final non-support beam pattern; and removing the sacrificial layer.

8 Claims, 5 Drawing Sheets

(58) Field of Classification Search
CPC ......... H01L 21/02381; H01L 21/02488; H01L 21/02491; H01L 21/02494; H01L 21/02658; H01L 29/12; H01L 21/20; H01L 21/3105; H01L 21/31144; H01L 21/3148; H01L 21/7681; H01L 21/76825
See application file for complete search history.

(56) References Cited

U.S. PATENT DOCUMENTS

| | | | | |
|---|---|---|---|---|
| 2010/0143848 | A1* | 6/2010 | Jain | B81C 1/0019 430/315 |
| 2011/0278566 | A1 | 11/2011 | Lee | |

FOREIGN PATENT DOCUMENTS

| | | |
|---|---|---|
| CN | 103241706 | 8/2013 |
| WO | 2006/118851 | 11/2006 |
| WO | 2011/126438 | 10/2011 |
| WO | 2015/010606 | 1/2015 |
| WO | 2015/014263 | 2/2015 |
| WO | 2015/024502 | 2/2015 |
| WO | 2015/027961 | 3/2015 |
| WO | 2015/081866 | 6/2015 |

OTHER PUBLICATIONS

Zhong et al., U.S. Appl. No. 14/902,517, International Application Filing Date Jul. 22, 2014.
Zhang et al., U.S. Appl. No. 14/902,519, International Application Filing Date Aug. 19, 2014.
Wang et al., U.S. Appl. No. 14/902,302, International Application Filing Date Sep. 2, 2014.
Zhang et al., U.S. Appl. No. 15/023,049, International Application Filing Date Dec. 3, 2014.
English Translation of PCT Search Report for International Application No. PCT/CN2014/093054; dated Feb. 15, 2015.

* cited by examiner

METHOD FOR MANUFACTURING THIN-FILM SUPPORT BEAM

FIELD OF THE INVENTION

The present invention relates to a technical field of micro electro mechanical systems, particularly relates to a method of manufacturing a film support beam.

BACKGROUND OF THE INVENTION

MEMS (Micro Electro Mechanical Systems) is developed along with the development of integrated circuit manufacturing techniques, and integrated circuit manufacturing techniques and micro fabrication techniques are the basic manufacturing technologies of MEMS. Different from the integrated circuit which only includes connection between planar transistors and metal, MEMS includes numerous complex three dimensional micro structures and movable structures. These three dimensional micro structures and movable structures generally include a film support beam. For stress matching and electrical connection, the film support beams are usually composed of multi-layer films, and some of the films need to be patterned separately. For example, a support beam of an infrared sensor is composed of several layers of dielectric films/metal films, the metal films are used to be electrically connected to sensitive films and substrate processing circuits, thus it need to be patterned separately. Generally, only the metal layer on the support beam and a contacting hole are preserved. The most common technique of manufacturing the film support beam is to use one step of photoetching and etching to manufacture the film pattern on the support beam and the other area needed to be patterned separately, such as the metal layer in the support beam of an infrared sensor, and then a final support beam pattern is manufactured by one step of photoetching and etching, at last, the support beam is manufactured via releasing techniques. In view of the alignment error of photoetching, the width of the support beam manufactured by such technique has to be greater than the width of the metal layer pattern, in other words, according to such technique, the smallest size of the manufactured support beam equals to the minimum line width plus twice of the optimal registration accuracy. For example, if a process capability of a certain semiconductor production line shows that the minimum line width is 0.5 μm and the optimal registration accuracy is +/−0.35 μm, the smallest size of the support beam manufactured by such method is 1.2 μm, and such method has a relatively high requirement of the registration accuracy of photoetching, which increase a manufacturing difficulty.

SUMMARY OF THE INVENTION

Accordingly, it is necessary to provide a method of manufacturing a film support beam, which is able to manufacture a support beam with a smallest size equal to a minimum line width, and the method has a relatively low requirement to the alignment accuracy of photoetching, thus can reducing the manufacturing difficulty.

In order to address the above problem, according to an aspect of the present disclosure, a method of manufacturing a film support beam is provided according to the present disclosure, which includes: providing a substrate having opposed first and second surfaces; coating a sacrificial layer on the first surface of the substrate, and patterning the sacrificial layer; depositing a dielectric film on the sacrificial layer to form a dielectric film layer, and depositing a metal film on the dielectric film layer to form a metal film layer; patterning the metal film layer, and dividing a patterned area of the metal film layer into a metal film pattern of a support beam portion and a metal film pattern of a non-support beam portion, wherein a width of the metal film pattern of the support beam portion is greater than a width of a final support beam pattern, and a width of the metal film pattern of the non-support beam portion is equal to a width of a final non-support beam pattern at the moment; photoetching and etching on the metal film layer and the dielectric film layer to obtain the final support beam pattern, the final non-support beam pattern and a final dielectric film layer, wherein the final dielectric film layer serves as a support film of the final support beam pattern and the final non-support beam pattern; and removing the sacrificial layer.

As a preferred embodiment of the present disclosure, the sacrificial layer is made of polyimide, and the sacrificial layer has a thickness of from 500 nm to 3000 nm.

As a preferred embodiment of the present disclosure, the sacrificial layer is made of porous silicon.

As a preferred embodiment of the present disclosure, the dielectric film is made of $SiO_2$, and the sacrificial layer has a thickness of from 100 nm to 2000 nm.

As a preferred embodiment of the present disclosure, the dielectric film is made of SiN.

As a preferred embodiment of the present disclosure, the metal film is made of Al, and the sacrificial layer has a thickness of from 100 nm to 3000 nm.

As a preferred embodiment of the present disclosure, the metal film is made of TiN.

As a preferred embodiment of the present disclosure, the sacrificial layer is removed by oxygen.

Compared to the prior art, the method of manufacturing the film support beam of the present disclosure is able to manufacture a support beam with a smallest size equal to a minimum line width, and has a relatively low requirement to the alignment accuracy of photoetching, thus can reduce a manufacturing difficulty.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION OF THE EMBODIMENTS

The details of one or more embodiments of the invention are set forth in the accompanying drawings and the description below. Other features, objects, and advantages of the invention will be apparent from the description and drawings.

Figure 1:
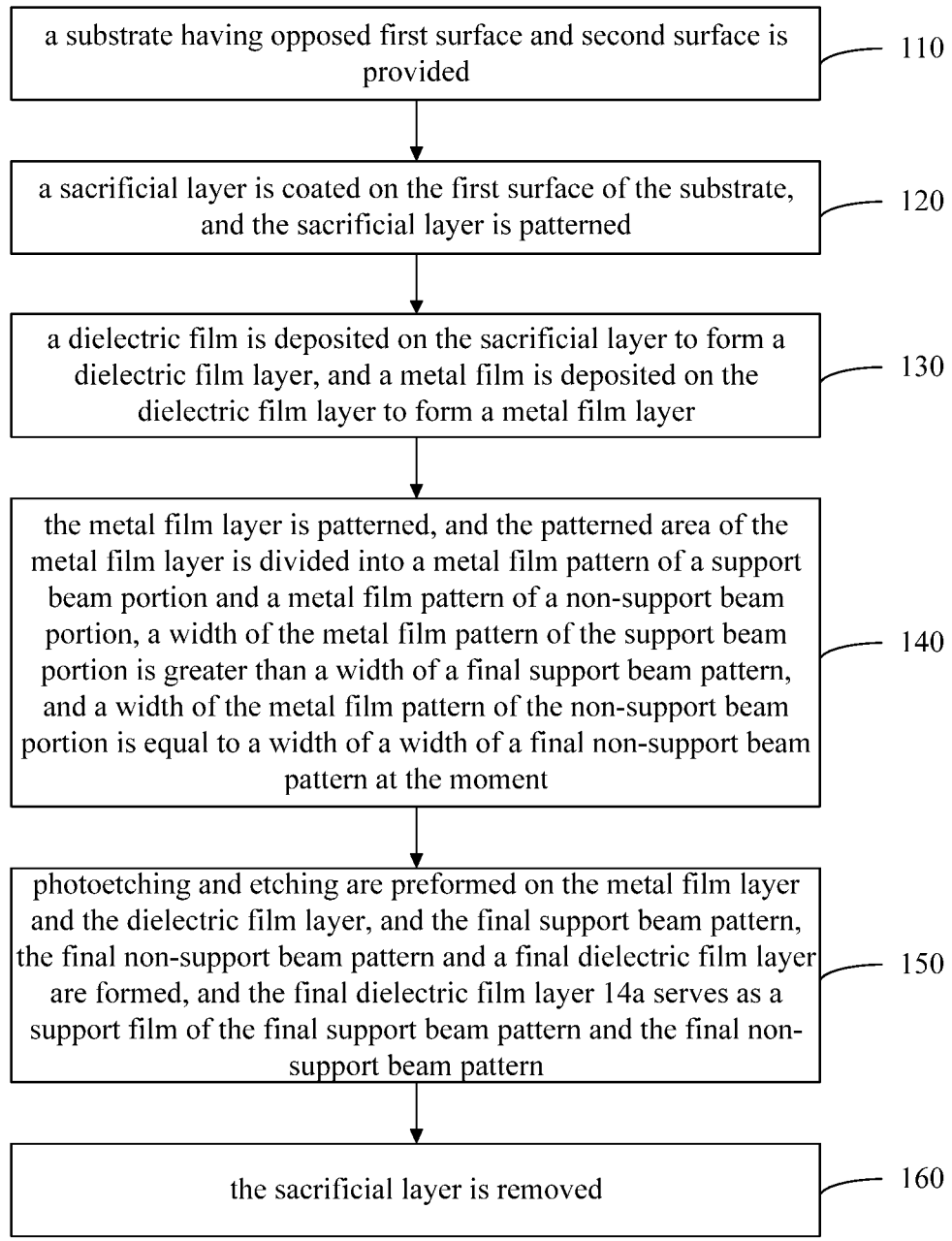
FIG. 1 is a flow chart of a method of manufacturing a film support beam in accordance with one embodiment.
Figure 2:
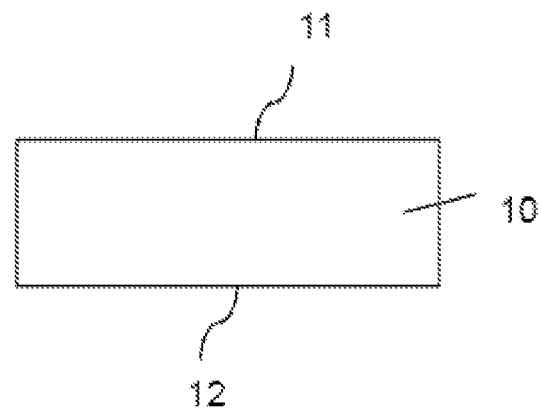
FIGS. 2 to 5 and FIG. 8 are cross-section views of a wafer obtained during manufacturing by using the method shown in FIG. 1.

Referring to FIG. 1, a method of manufacturing a film support beam in accordance with one embodiment includes the following steps:

In step 110, referring to FIG. 2, FIG. 2 is a cross-section views of a wafer obtained by this step, a substrate 10 having opposed first surface 11 and second surface 12 is provided. In the illustrated embodiment, the first surface 11 is an upper surface of the substrate 10.

Specifically, the substrate 10 is a wafer.

Figure 3:
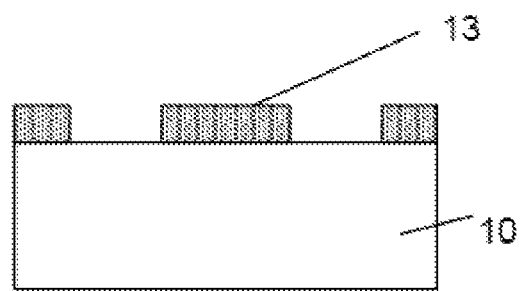

In step 120, referring to FIG. 3, FIG. 3 is a cross-section views of the wafer obtained by this step, a sacrificial layer 13 is coated on the first surface 11 of the substrate 10, and the sacrificial layer 13 is patterned.

Specifically, polyimide or porous silicon is coated on the first surface 11 of the substrate 10 to form the sacrificial layer 13, and the coating thickness of polyimide is from 500 nm to 3000 nm. then the sacrificial layer 13 is patterned. the patterning process here is for immobilizing the film support beam on the substrate 10.

Figure 4:
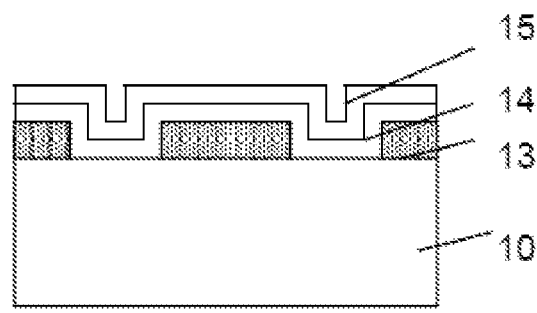

In step 130, referring to FIG. 4, FIG. 4 is a cross-section views of the wafer obtained by this step, a dielectric film is deposited on the sacrificial layer 13 to form a dielectric film layer 14, and a metal film is deposited on the dielectric film layer 14 to form a metal film layer 15.

Specifically, the dielectric film layer 14 serves as a support film of the film support beam, the dielectric film is made of $SiO_2$ or SiN, and the dielectric film layer 14 has a thickness of from 100 nm to 2000 nm. The metal film layer 15 is used for the stress matching and the electric connection of the film support beam, the metal film is made of Al or TiN, and the metal film layer 15 has a thickness of from 100 nm to 3000 nm.

Figure 5:
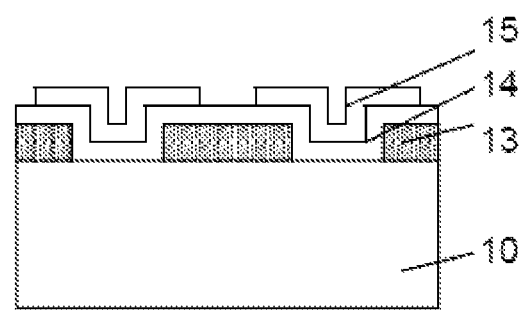
Figure 6:
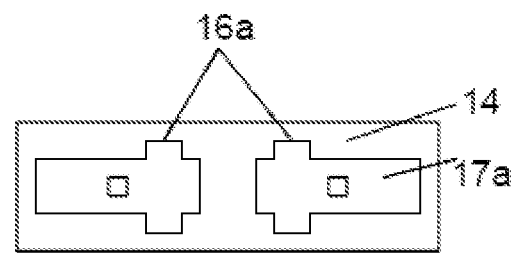
FIG. 6, FIG. 7, and FIG. 9 are top views of the wafer obtained during manufacturing by using the method shown in FIG. 1.

In step 140, referring to FIG. 5 and FIG. 6, FIG. 5 is a cross-section views of the wafer obtained by this step, FIG. 6 is a top view of the wafer obtained by this step, the metal film layer 15 is patterned, and the patterned area of the metal film layer 15 is divided into a metal film pattern of a support beam portion 16a and a metal film pattern of a non-support beam portion 17a, a width of the metal film pattern of the support beam portion 16a is greater than a width of a final support beam pattern 18, and a width of the metal film pattern of the non-support beam portion 17a is equal to a width of a width of a final non-support beam pattern 19 at the moment.

In the prior art, the width of the metal film pattern of the support beam portion is less than a width of a final support beam pattern.

Figure 7:
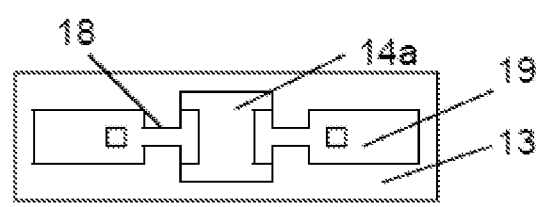

In step 150, referring to FIG. 7, FIG. 7 is a top view of the wafer obtained by this step, photoetching and etching are preformed on the metal film layer 15 and the dielectric film layer 14, and the final support beam pattern 18, the final non-support beam pattern 19 and a final dielectric film layer 14a are formed, and the final dielectric film layer 14a serves as a support film of the final support beam pattern 18 and the final non-support beam pattern 19.

In the illustrated embodiment, the final support beam pattern 18, the final non-support beam pattern 19, and a final dielectric film layer pattern 14a are simultaneously formed and obtained by only one step, thus avoiding the problem of photoetching alignment, and the support beam with the smallest size equal to the minimum line width can be manufactured.

In the prior art, the final support beam pattern is done in the prior step, and when manufacturing the dielectric film layer pattern of the support beam portion, it is necessary to ensure the dielectric film layer pattern is aligned with the metal film layer pattern in the prior step, so the smallest size of the manufactured support beam manufactured by the prior art equals to the minimum line width plus twice of the optimal registration accuracy, and the manufacturing difficulty is increased.

Figure 8:
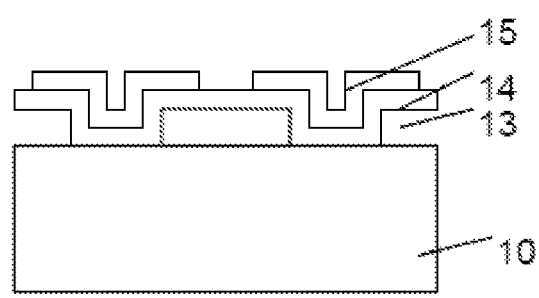
Figure 9:
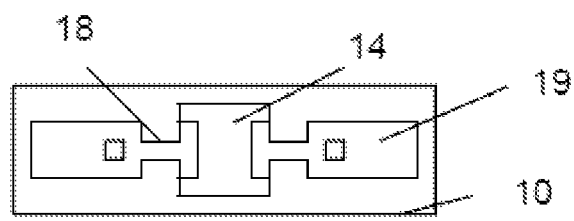

In step 160, referring to FIG. 8 and FIG. 9, FIG. 8 is a cross-section views of the wafer obtained by this step, FIG. 9 is a top view of the wafer obtained by this step, the sacrificial layer 13 is removed.

In an embodiment, the sacrificial layer 13 is removed by oxygen, and manufacturing of the film support beam structure is done.

Those skilled in the art should understand that one of the features or purposes is to finish the manufacturing of the sacrificial layer at first and then it is patterned, and then deposit the dielectric film layer and the metal film layer on the sacrificial layer, pattern the metal film layer, photoetch and etch on the dielectric film layer and the metal film layer to form the support beam pattern, the non-support beam pattern and the support film pattern, then remove the sacrificial layer to obtain the film support beam structure, in this way, the support beam with a smallest size equal to a minimum line width is manufactured, moreover, such method has a relatively low requirement to the alignment accuracy of photoetching, thus can reduce a manufacturing difficulty.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing a film support beam, comprising:
   providing a substrate having opposed first and second surfaces;
   coating a sacrificial layer on the first surface of the substrate, and patterning the sacrificial layer;
   depositing a dielectric film on the sacrificial layer to form a dielectric film layer, and depositing a metal film on the dielectric film layer to form a metal film layer;
   patterning the metal film layer, and dividing a patterned area of the metal film layer into a metal film pattern of a support beam portion and a metal film pattern of a non-support beam portion, wherein a width of the metal film pattern of the support beam portion is greater than a width of a final support beam pattern, and a width of the metal film pattern of the non-support beam portion is equal to a width of a width of a final non-support beam pattern;
   photoetching and etching the metal film layer and the dielectric film layer to obtain the final support beam pattern, the final non-support beam pattern, and a final dielectric film layer, wherein the final dielectric film layer serves as a support film of the final support beam pattern and the final non-support beam pattern; and
   removing the sacrificial layer.

2. The method of manufacturing the film support beam of claim 1, wherein the sacrificial layer is made of polyimide, and the sacrificial layer has a thickness of from 500 nm to 3000 nm.

3. The method of manufacturing the film support beam of claim 1, wherein the sacrificial layer is made of porous silicon.

4. The method of manufacturing the film support beam of claim 1, wherein the dielectric film is made of $SiO_2$, and the dielectric film layer has a thickness of from 100 nm to 2000 nm.

5. The method of manufacturing the film support beam of claim 1, wherein the dielectric film is made of SiN.

6. The method of manufacturing the film support beam of claim 1, wherein the metal film is made of Al, and the metal film layer has a thickness of from 100 nm to 3000 nm.

7. The method of manufacturing the film support beam of claim 6, wherein the metal film is made of TiN.

8. The method of manufacturing the film support beam of claim 1, wherein the sacrificial layer is removed by oxygen.

\* \* \* \* \*